United States Patent
Schrögmeier et al.

(10) Patent No.: US 6,804,165 B2
(45) Date of Patent: Oct. 12, 2004

(54) LATENCY TIME SWITCH FOR AN S-DRAM

(75) Inventors: Peter Schrögmeier, München (DE); Stefan Dietrich, Turkenfeld (DE); Sabine Kieser, Hausham (DE); Pramod Acharya, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/374,657

(22) Filed: Feb. 26, 2003

(65) Prior Publication Data

US 2003/0218921 A1 Nov. 27, 2003

(30) Foreign Application Priority Data

Feb. 28, 2002 (DE) .......................... 102 08 715

(51) Int. Cl.[7] .............................................. G11C 8/00
(52) U.S. Cl. .................... 365/233; 365/194; 365/189.07
(58) Field of Search ................................ 365/233, 194, 365/189.07

(56) References Cited

U.S. PATENT DOCUMENTS

| | | |
|---|---|---|
| 5,995,441 A | 11/1999 | Kato et al. |
| 6,141,721 A * | 10/2000 | Patterson et al. ...... 365/189.04 |
| 6,198,682 B1 * | 3/2001 | Proebsting .................. 365/207 |
| 6,314,052 B2 | 11/2001 | Foss et al. |

* cited by examiner

*Primary Examiner*—Richard Elms
*Assistant Examiner*—Tuan T. Nguyen
(74) *Attorney, Agent, or Firm*—Jenkins, Wilson & Taylor, P.A.

(57) ABSTRACT

Latency time circuit for an S-DRAM (1), which is clocked by a high-frequency clock signal (CLK), for producing a delayed data enable signal for synchronous data transfer through a data path (38) of the S-DRAM (1), having a controllable latency time generator (57) for delaying a decoded external data enable signal (PAR) with an adjustable latency time, which a comparison circuit (60) which compares a cycle time ($t_{cycle}$) of the high-frequency clock signal (CLK) with a predetermined signal delay time of the data path (38), and reduces the latency time of the latency time generator (57) by the cycle time if the signal delay time of the data path (38) is greater than the cycle time ($t_{cycle}$) of the clock signal (CLK)

19 Claims, 13 Drawing Sheets

LATENCY TIME SWITCH FOR AN S-DRAM

TECHNICAL FIELD

The invention relates to a latency time circuit for an S-DRAM according to the precharacterizing clause of Patent claim 1.

BACKGROUND ART

D-RAM modules are standard memory modules for main memories. D-RAM memories are composed of large-scale integrated transistors and capacitors. In order to obtain the information, the memory contents must be continuously refreshed in this case. A synchronous D-RAM (S-DRAM) allows memory access without any additional waiting cycles. In this case, the data is transferred between the S-DRAM and an external data bus in synchronism with the external clock signal.

FIG. 1 shows an S-DRAM memory module according to the prior art. The S-DRAM memory module is connected to an external control bus, to an external address bus and to an external data bus. The control commands which are applied to the external control bus are read in via command PADS by means of an integrated command receiver, and the received signals are applied, after signal amplification, to a command decoder. The command decoder decodes the applied control commands which, by way of example, have a length of 4 bits, to form internal control commands, for example write (WR) and read (RD). The S-DRAM contains a state machine or sequence controller which controls the internal sequences as a function of the decoded internal control commands. The sequence controller is clocked by a clock signal. For this purpose, an external clock signal $CLK_{ext}$ is applied to the S-DRAM, and the signal is amplified by means of an integrated clock signal receiver. The amplified clock signal is distributed in the form of a tree in the integrated S-DRAM by means of a clock tree, and is passed via an internal clock line to a sequence controller. The external clock signal is furthermore applied to a delay locked loop DLL. The delay locked loop DLL causes a negative phase shift in the applied external clock signal CLK. The internal DLL clock signal precedes the external clock signal in order that the data is applied to the data pads in synchronism with the external clock signal. The DLL clock signal $DLL_{CLK}$ is used for clocking the output signal driver OCD (Off Chip Driver), which is integrated in the S-DRAM, for one data path. The delay locked loop DLL is followed by a delay element which forms an internal clock signal (VE-CLK) which is modeled such that it is identical to the external clock signal, that is to say VE-CLK is completely in synchronism with $CLK_{ext}$. The delay element for this purpose compensates for the negative phase shift in the delay locked loop DLL.

The internal sequence controller produces control signals for the internal processing sequence of the S-DRAM as a function of the decoded commands. The sequence controller generates an RAS signal (Row Address Strobe) for driving a row address latch, and a CAS signal (Column Address Select) for driving a column address latch. The row address latch and the column address latch are connected via an internal address bus to an address signal receiver for the S-DRAM. Via the external address bus, the S-DRAM receives an external address at the address PADS, with the applied address signals being amplified by an address receiver. In order to save connections, the address is entered in DRAM memories in two steps. In a first step, the lower address bits are loaded together with the RAS signal into the row address latch. In a second step, the most significant address bits are loaded, together with the CAS signal, into the column address latch. The address bits are applied to a row or column decoder, respectively, for access to a memory row within the memory cell array, which is in the form of a matrix. The row address latch and the column address latch as well as the row and column decoders together form an address signal decoder. In order to refresh the memory cells, the memory cell array receives a refresh control signal from the sequence controller. A refresh counter, which receives an enable signal from the sequence controller, produces all the existing row addresses successively, and these are then applied to the address bus. For this purpose, the sequence controller produces an RAS control signal. A word line is activated in order to refresh all the memory cells which are connected to it.

The memory cell array is also connected to read/write amplifiers. The number of read/write amplifiers depends on the memory architecture, on the word length and on the prefetch. In the case of a prefetch 4 with a word length of 32, for example, 128 read/write amplifiers are in operation at the same time. If, by way of example, four independent memory banks are provided, a total of 512 read/write amplifiers are integrated on the memory chip.

One data bit is in each case written to an addressed memory cell, or is read from it, via the read/write amplifiers. The read/write amplifiers are connected via an internal data bus to an internal bus path in the S-DRAM. The data in the external data bus is written synchronously via the data path to the S-DRAM, and is emitted synchronously from the S-DRAM. The data path is connected to the data PADS of the S-DRAM.

In order to read data, the data path has a data receiver for receiving the externally applied data. An internal driver circuit for the data to be read (WR driver) amplifies the signals in the received data and emits the data that has been read via the internal bus to the read/write amplifiers. The driver circuit WR driver is driven by a write/latency time generator, which is clocked by the internal clock signal VE-CLK. The write/latency time generator is itself connected to a decoder.

For synchronous data emission, the data path contains a data FIFO register, which is followed by an output data driver circuit (OCD driver). The FIFO register is driven by the read/write amplifier by means of an input pointer and by a read/latency generator by means of an output pointer or a delayed data enable signal. The read/latency generator is likewise connected to a decoder.

The two decoders for the read/latency time generator and for the write/latency time generator are connected via internal control lines to a mode register, in which the data for controlling the operating modes is stored within the S-DRAM. The mode register can be initialized by means of a mode register set command via the internal address bus. The mode register is initialized after switch on. Before any external control commands are applied to the S-DRAM, the mode register is initialized. The mode register contains control data for the CAS latency time, for test modes and for a DLL reset.

The sequence controller generates an internal write command PAW as a function of the external control commands, in order to activate the write/latency time generator, and generates an internal read command PAR for activation of the read/latency time generator.

FIG. 2 shows a timing diagram to explain the method of operation of a conventional S-DRAM. An external clock signal CLK-external is applied to the S-DRAM. Depending on the decoded read command RD, the state machine or sequence controller generates an internal read command signal $PAR_{int}$. The read command is applied relative to a rising signal flank by the external clock signal $CLK_{ext}$. The clock signal is received and distributed. The internal clock signal $CLK_{int}$ is used to transfer the command, and then to decode it. The sequence controller produces, for example, an internal clock signal $PAR_{int}$.

The internal clock signal $PAR_{int}$ is generated with a certain signal delay, namely a decoding time $\Delta t_{DEC}$. This decoding time comprises a signal delay resulting from the clock signal receiver, on the basis of the clock signal line tree (clock tree) and on the basis of signal delays within the sequence controller.

$$t_{DEC}=t_{CLK_{RECEIVER}}+t_{CKL_{TREE}}+t_{Latch}+t_{CMD_{Decode}}+t_{PAR_{Generation}}$$

The generated internal read signal $PAR_{int}$ is applied with a short signal delay to the read/write amplifiers, which emit the data to be read out to the internal data bus. The data is passed with the further time delay $\Delta t_{FIFO}$ from the internal data bus via the FIFO register within the data path to the input of the OCD driver. The OCD driver, or data output driver, emits the data with a further signal delay $\Delta t_{OCD}$ to the data PADS of the S-DRAM. There is a delay time At between the flank of the external clock signal at which the decoded internal read command RD is applied and the data output via the data PADS.

FIG. 3 shows a latency time generator according to the prior art, which is contained in the data path of the conventional S-DRAM. The conventional latency time generator illustrated in FIG. 3 receives the internal read signal $PAR_{int}$ from the sequence controller. The internal read signal is synchronized to the DLL clock by means of a synchronization circuit, which comprises a first synchronization latch A and a second synchronization latch B. The clock signal VE-CLK is completely synchronized to the external clock signal CLK-external. In a first step, PAR is synchronized to the VECLK (latch A) and, in a second step, it is synchronized to the DLL-CLK. The internal read signal $PAR''_{int}$ that has been synchronized in this way is applied to a chain of series-connected time switching elements, each of which causes a delay of one clock cycle. The time switching elements are clocked by the clock signal DLL-CLK. Each of the time switching elements produces a signal delay which is identical to the cycle time of the $\Delta t_{cycle}$ of the external clock signal.

In the read/latency time generator as illustrated in FIG. 3 and according to the prior art, the CAS latency time is stored in the mode register, in which case, by way of example, it is possible to store a CAS latency time of 6, a CAS latency time of 5 and a CAS latency time of 4 in the mode register. Memories also exist with other latency times, for example 2, 3 or 7. The read latency time or CAS latency time indicates a number of clock cycles between the application of the external read command and the appearance of the emitted data at the OCD driver. The expression read latency means the number of clock cycles which pass between application of a read command to a synchronous memory and the appearance of the requested data at the output of the memory. A short read latency has the advantage that a connected controller requires fewer waiting cycles. Depending on the lengths of the internal signal delay times, decoding times and amplifier delay times on the memory chip, a short read latency can be achieved, or longer read latency times must be accepted. One important influencing factor in this case is the quality of the production process. These process fluctuations, however, not only govern the read latencies of the memory chip but are also a main influencing factor for the capability of the memory chip to achieve high clock rates.

The expression write latency means the number of clock cycles which pass between the application of a write command and the application of the data to the inputs of the memory chip. The read latency time for conventional S-DRAMs can be programmed into a mode register. The write latency in the case of the DDR2 Standard is coupled to the read latency and is one clock cycle less than the read latency.

Write Latency=Read Latency−1.

In order to achieve a read latency time or CAS latency time of CAS=6, the synchronized internal read signal $PAR''_{int}$ is applied to the chain of timing elements and is delayed with a delay which corresponds to four times the clock cycle time $\Delta t_{cycle}$. In order to achieve a CAS latency time of 5, the synchronized internal read signal passes through only three timing elements, and, in order to achieve a CAS latency time of 4, the synchronized internal read signal passes through only two timing elements. In a corresponding manner, three inputs are provided on an internal multiplexer for the latency time generator, and are connected to outputs of timing elements within the chain. The decoder decodes the desired CAS latency time, which is stored digitally in the mode register, and drives the multiplexer via a control line. If, for example, a CAS latency time of 4 is stored in the mode register, the decoder connects the third input of the multiplexer to the output control line. The multiplexer is connected on the output side to the FIFO register, and emits a delayed enable signal to the FIFO register.

FIG. 4 shows a timing diagram to explain the function of the latency time generator or latency time counter according to the prior art. The example illustrated in FIG. 4 shows the procedure for a stored CAS latency time of 4. The decoder identifies the CAS latency time of 4, and connects the third input of the multiplexer, so that a time delay is produced by two clocked timing elements. Since the timing elements are clocked by the internal clock signal DLL-CLK, the data is enabled with a time delay after the fourth rising flank of the DLL-CLK clock signal. The internal read command signal which is applied to the latency time generator is in fact passed to the latency time generator only after a time delay of $\Delta t_{DEC}$.

As the clock frequency of the external clock signal rises, the cycle time $t_{cycle}$ of the clock signal decreases. If the clock rate is 500 MHz, the cycle time $t_{cycle}$ is now only 2 ns, and is in the same order of magnitude as the signal delay times on the chip. Since the time delay $\Delta t_{DEC}$ is constant, a situation occurs when the clock signal frequency is very high in which the signal delay $\Delta t_{DEC}$ is greater than the cycle time $t_{cycle}$. If the signal delay $\Delta t_{DEC}$ is greater than the cycle time, the signal PAR is synchronized to PAR' with the second VE-CLK signal flank, instead of with the first VE signal flank.

If there is a time offset between DLL-CLK and VE-CLK which is greater than one clock cycle time $t_{cycle}$, the synchronization of $PAR'_{int}$ to $PAR''_{int}$ takes place with the second DLL-CLK signal flank instead of with the first DLL-CLK flank or, if the first failure mechanism has already occurred, with the DLL-CLK signal flank three of the DLL-CLK flank 2.

The read latency counter according to the prior art thus switches a very high-frequency applied clock signal one clock signal too late, and the S-DRAM incorrectly emits the data too late. This in turn leads to considerable malfunctions of the overall system, in particular of the microprocessor which is connected to the S-DRAM.

FIG. 5 shows the read access to an S-DRAM memory.

FIG. 5a shows the situation where the external clock signal is at a relatively low frequency, and the data is emitted correctly by the S-DRAM.

FIG. 5b shows the situation for a very high-frequency clock signal, in which the conventional S-DRAM will malfunction if the time offset between DLL-CLK and VE-CLK is greater than one clock cycle time $t_{cycle}$.

In order to avoid the malfunctioning of the read/latency time generator according to the prior art as described above, attempts have so far been made to minimize the signal delay times in order to reduce the delay time $\Delta t_{DEC}$.

However, at very high clock frequencies, minimizing the signal delay times reaches its limits, and is not sufficient to prevent a malfunction.

SUMMARY OF THE INVENTION

The object of the present invention is thus to provide a latency time circuit for an S-DRAM which operates in a fault-free manner even with a very high-frequency clock signal, that is to say it emits a data enable signal with the desired latency time to the data path.

This object is achieved by a latency time circuit having the features specified in Patent claim 1.

The invention provides a latency time circuit for an S-DRAM, by means of which a high-frequency clock signal (CLK) is clocked, for producing a delayed internal data enable signal for synchronous data transfer through a data path of the S-DRAM, having:
a controllable latency time generator for delaying a decoded external data enable signal with an adjustable latency time,
with a comparison circuit being provided, which compares
 a cycle time ($t_{cycle}$) of the high-frequency clock signal (CLK) with a predetermined signal delay time of the data path, and reduces the latency time of the latency time generator by the cycle time if the signal delay time of the data path is greater than the cycle time of the clock signal.

In one preferred embodiment of the latency time circuit according to the invention, a register is provided for storing a predetermined latency time.

Furthermore, a decoder is preferably provided, which decodes the stored latency time in order to produce an internal clock signal for the latency time generator.

In one preferred embodiment of the latency time circuit according to the invention, the comparison circuit emits a correction indication signal to the decoder if the signal delay time of the data path is greater than the cycle time ($t_{cycle}$) of the clock signal (CLK).

In one particularly preferred embodiment of the latency time circuit according to the invention, the controllable latency time generator has a number of series-connected clocked time switching elements, each of which passes on a signal which is applied to a signal input, in each case delayed by the cycle time ($t_{cycle}$), at a signal output.

The signal outputs of the time switching elements are preferably each connected to one signal input of a controllable multiplexer within the latency time generator.

The multiplexer preferably has a control input for the internal control signal which is emitted by the decoder.

The signal delay of all the series-connected time switching elements is preferably equal to a maximum programmable latency time minus two.

In one particularly preferred embodiment of the latency time circuit according to the invention, the decoder drives the multiplexer in the absence of the correction indication signal such that the signal delay which is produced by the time switching elements is equal to the programmed latency time reduced by two cycle times, and the decoder drives the multiplexer on receiving the correction indication signal such that the signal delay which is produced by the time switching elements is equal to the programmed latency time reduced by a further cycle time.

The latency time generator preferably has a synchronization circuit for synchronization of the decoded data enable signal to an internal clock signal.

In one particularly preferred embodiment of the latency time circuit according to the invention, the comparison circuit contains
a test signal generator for producing a test signal,
a data path delay time circuit, which delays the test signal that is produced by the signal delay time of the data path,
a clocked clock pulse generator for producing a clock pulse whose pulse duration is equal to the cycle time of the clock signal (CLK),
a transfer switching gate with an input for application of the delayed test signal,
a clock input for application of the clock pulse that is produced and having an output to which the test signal which is produced is passed on when the delay time of the delay time circuit is longer than the pulse duration of the clock pulse which is produced by the clock pulse generator, and
a latch circuit for temporary storage of the passed-on test signal.

The test signal is preferably a logic-high signal pulse with a long pulse duration.

The test signal which is passed on is preferably temporarily stored as a correction indication bit in the latch circuit.

The data path delay time circuit which is contained in the comparison circuit is preferably a circuit whose layout is identical to that of the data path.

The test signal generator preferably produces the test signal after receiving an enable signal from an internal sequence controller of the S-DRAM.

The data path which is contained in the S-DRAM preferably has a data FIFO register and a data output driver circuit (OCD).

The data path delay time circuit in a further embodiment comprises a number of series-connected delay elements, each of whose signal outputs can be passed on to a latch circuit through an associated transfer switching gate.

In one particularly preferred embodiment of the latency time circuit according to the invention, the comparison circuit is integrated in a DLL circuit of the S-DRAM.

Preferred embodiments of the latency time circuit according to the invention will be described in the following text with reference to the attached figures in order to explain features which are significant to the invention.

DETAILED DESCRIPTION OF THE INVENTION

Figure 1:
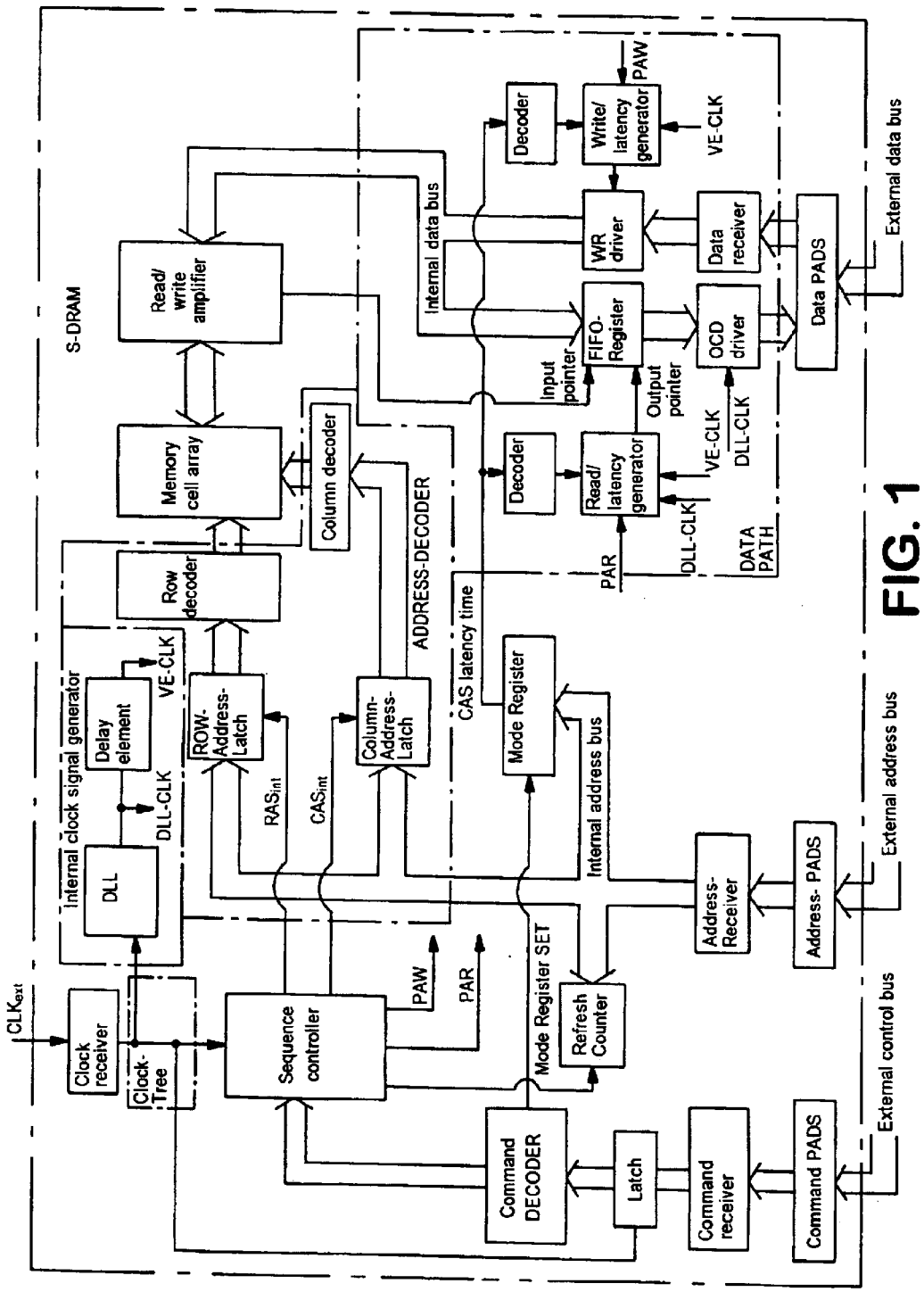
FIG. 1 shows a block diagram of a conventional S-DRAM according to the prior art.
Figure 2:
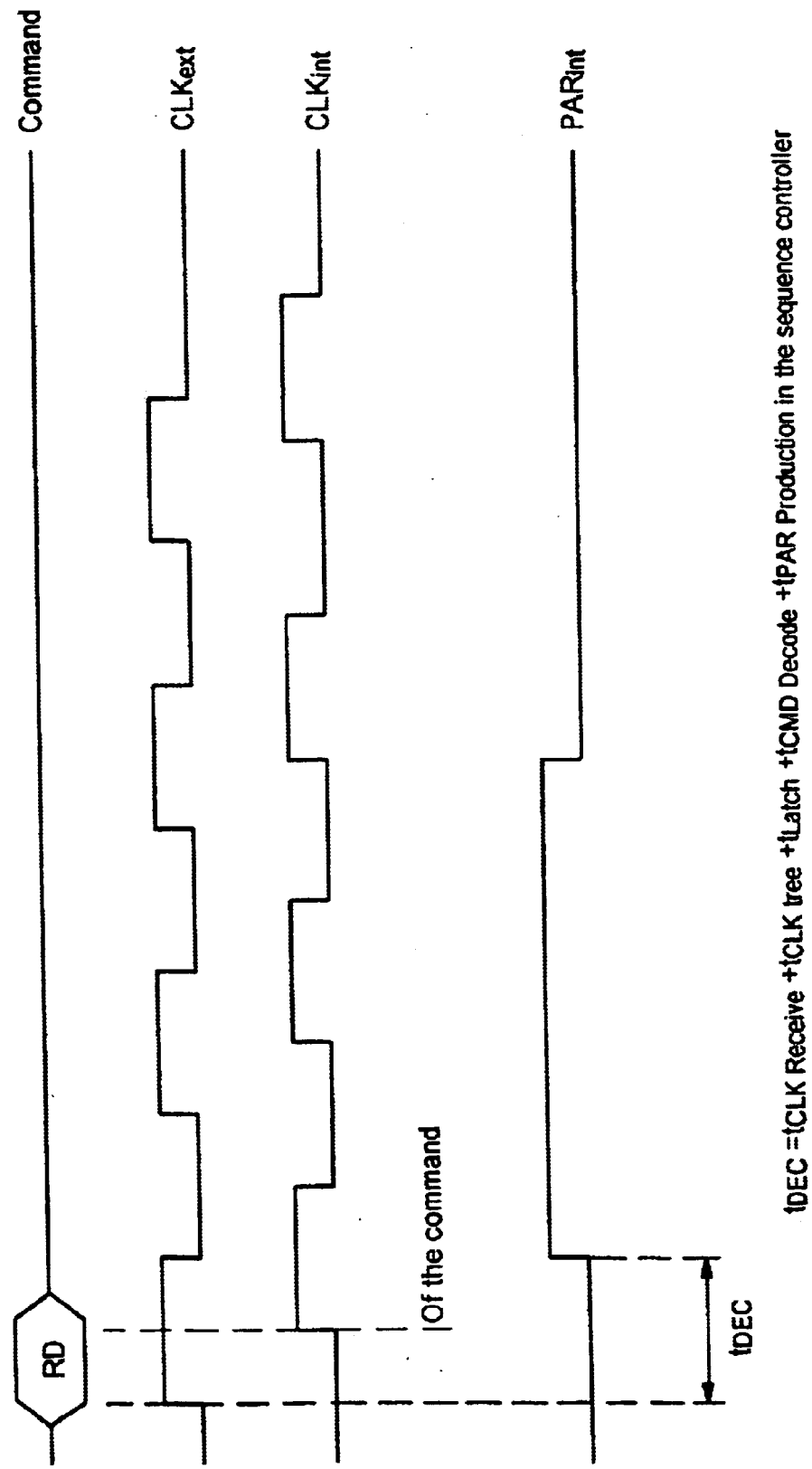
FIG. 2 shows a flowchart of the data output for a conventional S-DRAM according to the prior art.
Figure 3:
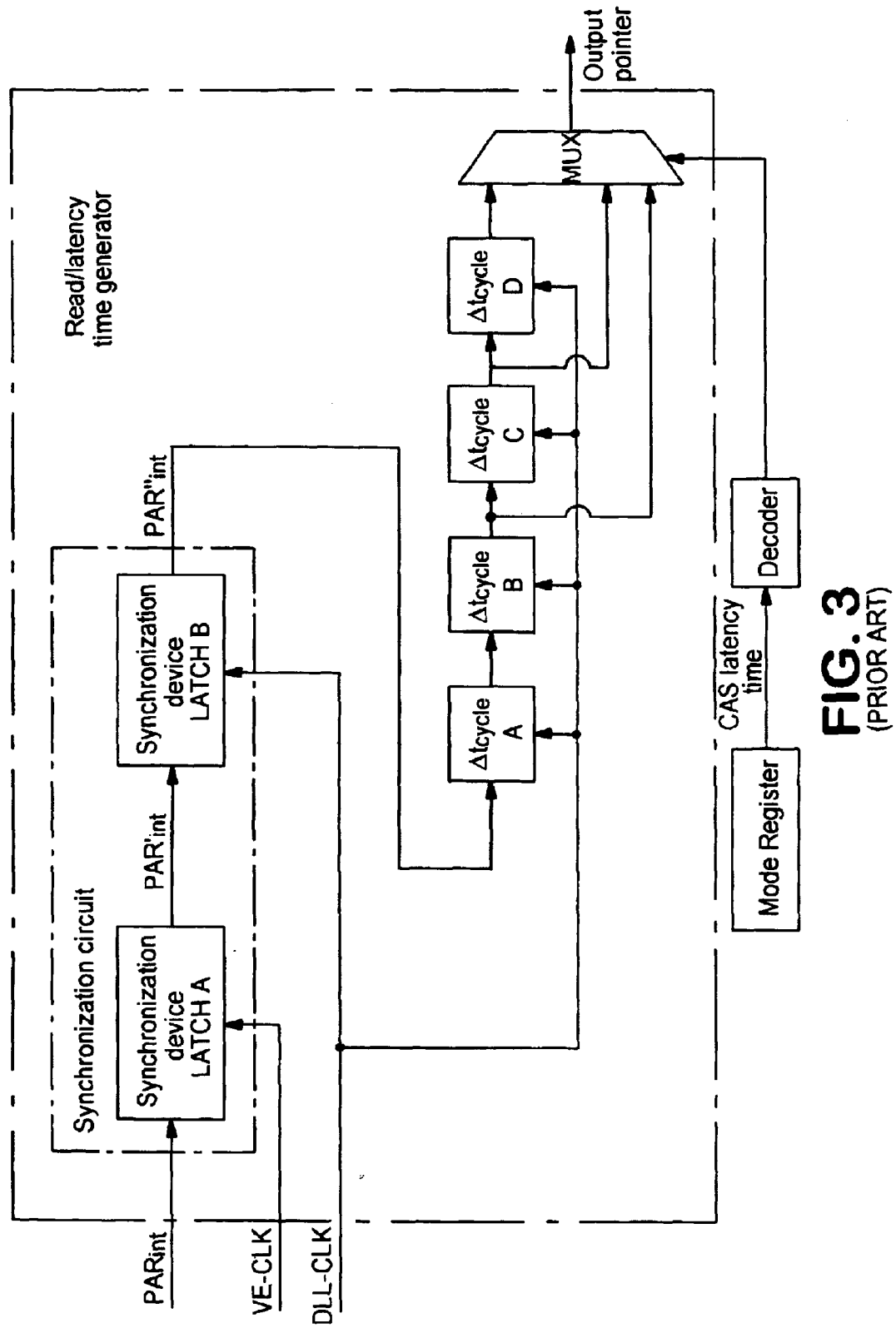
FIG. 3 shows a conventional latency time circuit according to the prior art.
Figure 4:
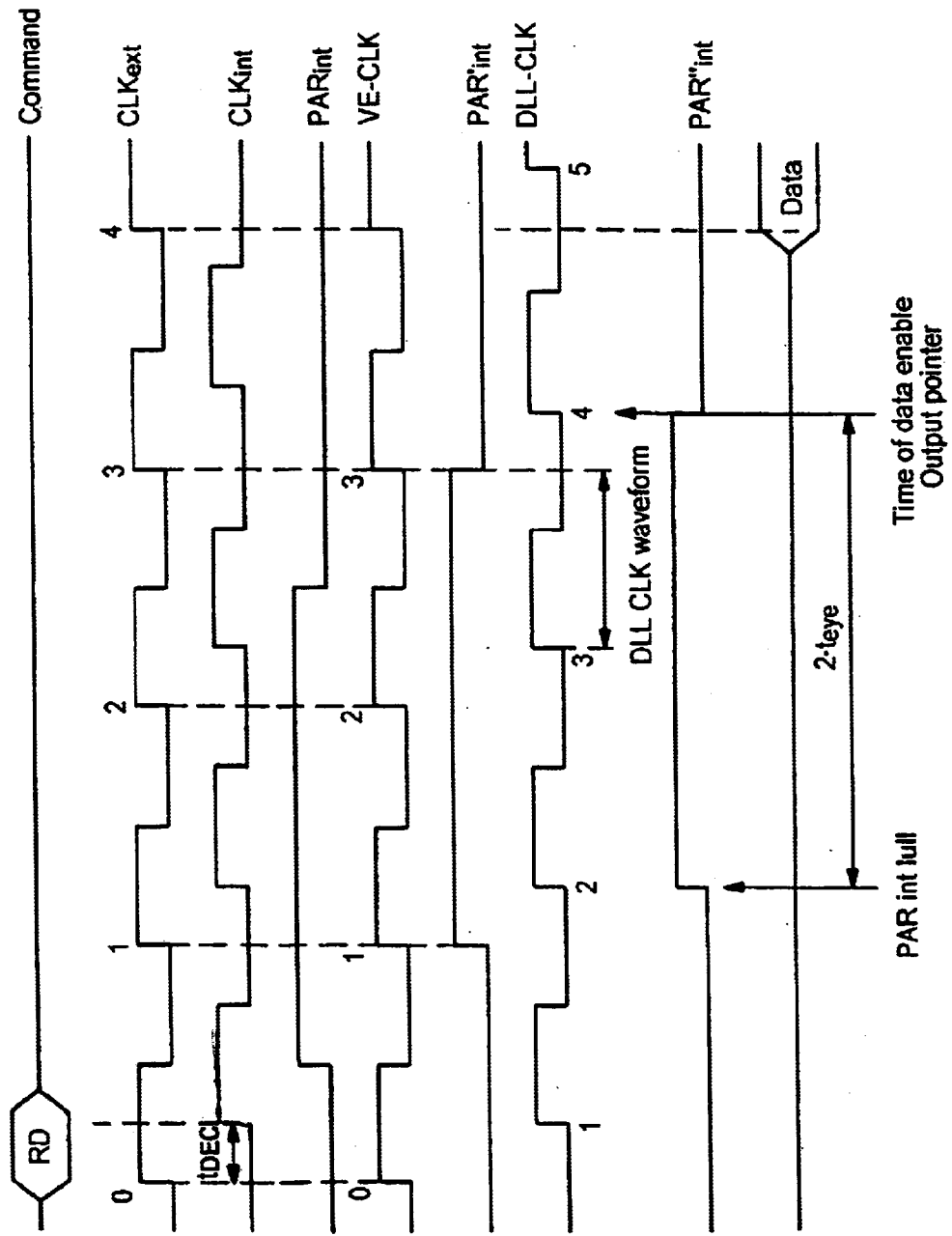
FIG. 4 shows a signal timing diagram for a conventional latency time circuit according to the prior art.
Figure 5A:
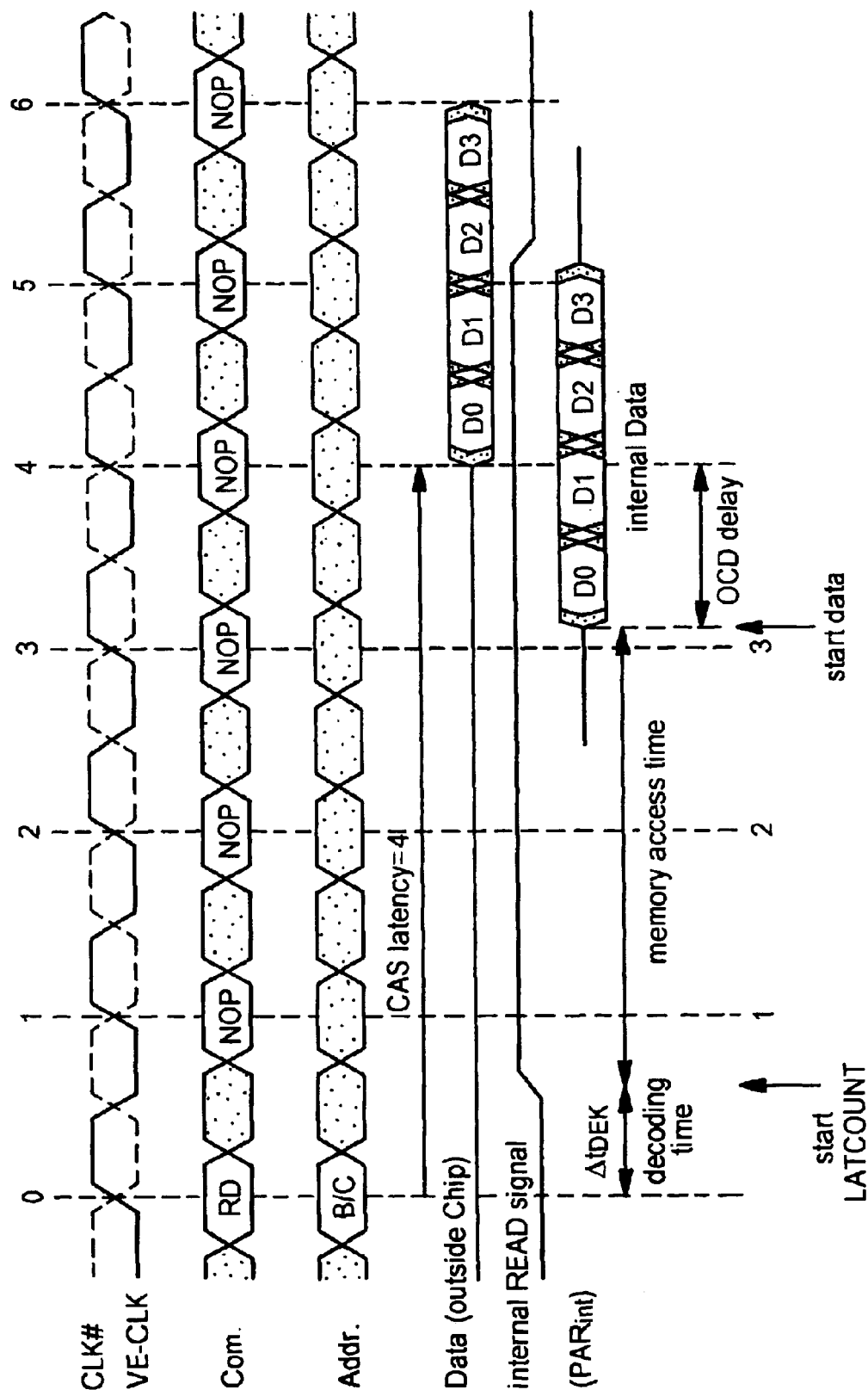
FIGS. 5a and 5b shows flowcharts to explain the problems on which the latency time circuit according to the invention is based.
Figure 5B:
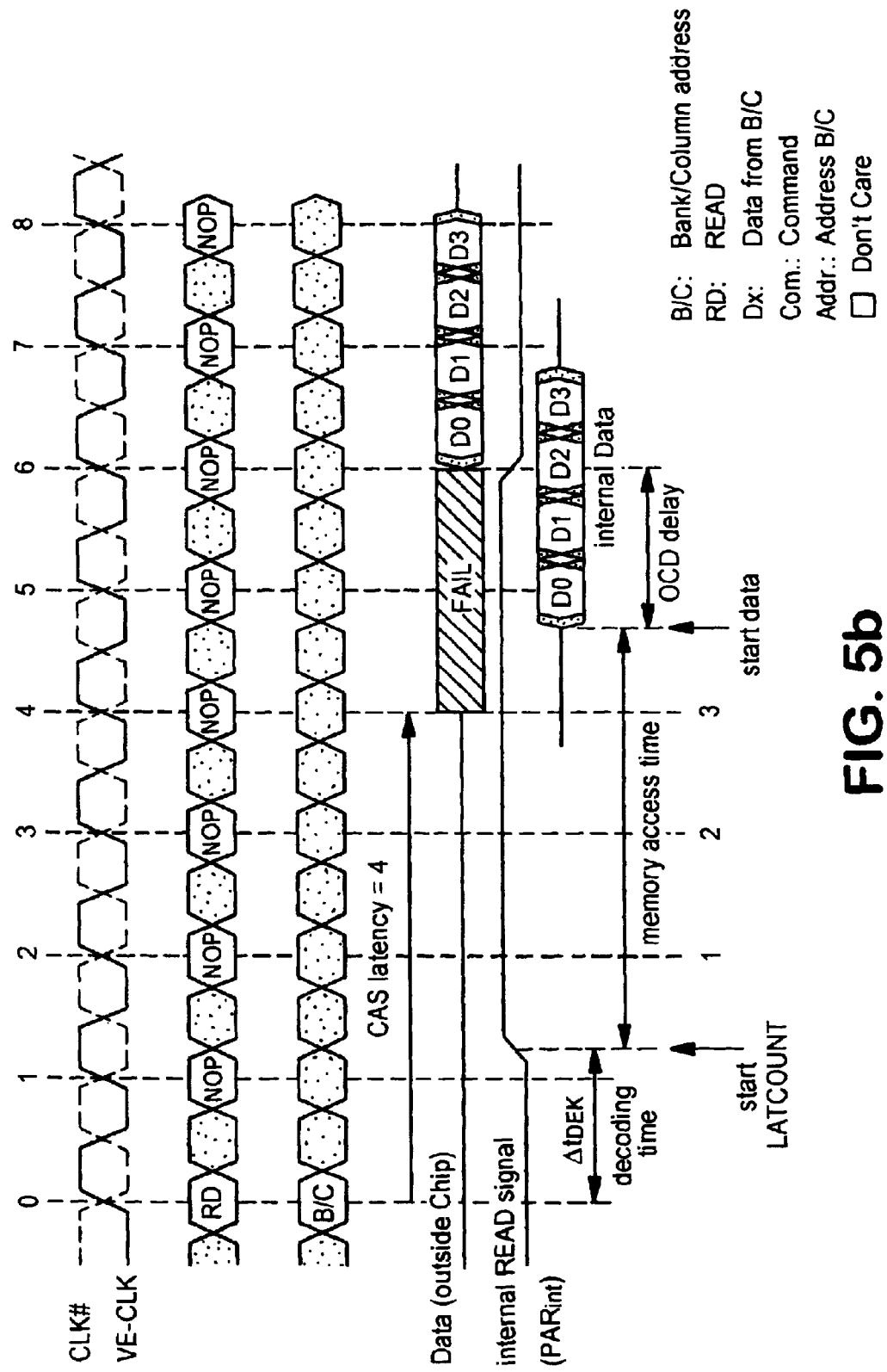
Figure 6:
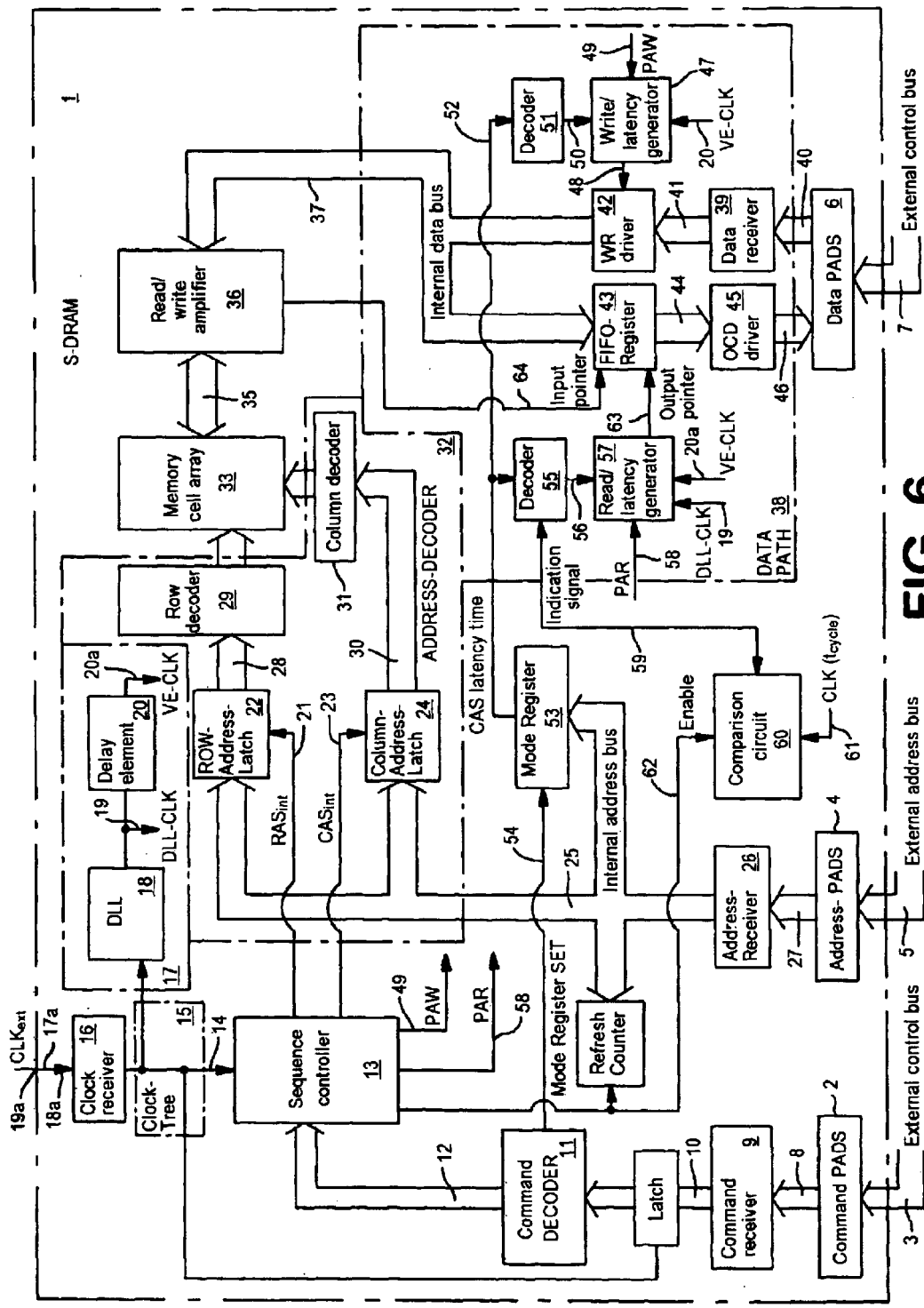
FIG. 6 shows a block diagram of an S-DRAM according to the invention.

As can be seen from FIG. 6, the S-DRAM 1 has command PADS 2 for connection to an external control bus 3. Furthermore, the S-DRAM 1 is connected via address PADS 4 to an external address bus 5, and via data PADS 6 to an external data bus 7. Via the command PADS 2, the S-DRAM receives external control commands, which are applied to a control command receiver via internal lines 8. The received external control commands are applied via internal lines 10 to a command decoder 11, for decoding. The command decoder 11 decodes the external control commands and generates internal control commands such as read (RD) or write (WR), which are emitted via internal control lines 12 to an integrated state machine or sequence controller 13 for the S-DRAM. The sequence controller 13 uses the control commands to generate sequence control commands for controlling the internal sequences of the S-DRAM 1.

The sequence controller 13 receives (via a clock signal line 14) an internal clock signal which is emitted from a clock signal receiver 16 via a clock signal line tree 15. The clock signal receiver 16 is connected via a clock line 17a to a clock signal PAD 18a in order to receive an external main clock signal CLK-external via an external clock signal line 19a. The received external clock signal is also passed via the clock signal line tree 15 to an internal clock signal generator circuit 17 within the S-DRAM 1. An internal clock signal DLL-CLK is first of all produced in a delay locked loop 18, with a negative phase shift in comparison to the external clock signal. The negative phase shift in this case preferably corresponds essentially to the data signal time delay of the data path. The internal clock signal DLL-CLK which is produced is emitted via an internal clock signal line 19. The DLL circuit 18 is followed by a delay element 20, which produces an internal clock signal VE-CLK, which is synchronized completely to the external clock signal CLK-external. The synchronous internal clock signal VE-CLK is emitted via a clock signal line 20a.

The internal sequence controller 13 produces an internal RAS signal, which is emitted via a control line 21 to a row address latch 22. The sequence controller 13 furthermore generates an internal CAS signal, which is emitted via a line 23 to a column address latch 24. The row address latch circuit 22 as well as the column address latch circuit 24 are connected via an internal data bus 25 to the output of an address signal receiver 26, which receives (via internal lines 27) the external address signal which is applied to the address signal PADS 4.

The row address latch circuit 22 is connected via internal address lines 28 to a row decoder 29, and the column address latch circuit 24 is connected via internal address lines 30 to a column decoder 31. The two latch circuits 22, 24 and the two decoders 29, 31 together form an address decoder 32 within the S-DRAM. Memory cells within a memory cell array 33 are addressed by means of the address decoder 32. The memory cells are refreshed at regular time intervals by means of a refresh control command, which is generated by the sequence controller 13. The memory cell array 33 thus receives an appropriate refresh command from the sequence controller 13 via a refresh control line 34.

The memory cell array 33 is also connected via internal data lines 35 to a read/write amplifier 36. The read/write amplifier is connected via an internal data bus 37 to a data path 38 within the S-DRAM 1. The data path 38 ensures that data is transmitted synchronously to the external data bus 7.

The data path 38 is used for writing data and for outputting data.

A data receiver 39 receives external data, which is to be written to the data PADS 6, via internal data lines 40. The received data is passed via data lines 41 to a driver circuit 42, whose output side is connected to the internal data bus 37.

Conversely, the data to be emitted is applied via the internal data bus 37 to a FIFO register 43, and is passed via data lines 44 to an output data driver 45. The output data driver 45 OCD (Off Chip Driver) emits the data to be emitted via data lines 46 to the data PADS 6.

In order to write data in a synchronized manner, the driver circuit 42 contains [sic] an enable signal from a write/latency time generator 47 via a control line 48. The write/latency time generator 47 receives an internal write command signal PAW, which is generated by the sequence controller 13, via a control line 49. The write/latency time generator 47 is furthermore connected via lines 50 to a decoder 51, which decodes the operating mode data that is applied to an internal control bus 52. The internal control bus 52 is used for reading operating mode data that is stored in an operating mode register 53.

The operating mode register 53 can be initialized via the internal address bus 25. To do this, on receiving a corresponding external control command, the command decoder 11 generates a mode register set command, which is applied to the mode register 53 via a control line 54. The mode register 53 reads the operating mode data which is applied to the internal address bus 25 at that time, and stores it.

The internal control bus 52 is furthermore connected to a decoder 55, which decodes the operating mode data that is applied to the internal control bus 52, and drives a read/latency time generator 57 via a control line 56. The read/latency time generator 57 receives (via a control line 58) an internal read command signal $PAR_{int}$, which is generated by the sequence controller 13.

In the latency time circuit according to the invention, the decoder 55 receives an indication signal from a comparison circuit 60 via an indication signal line 59. The comparison circuit 60 is clocked via an internal clock line 61 with an internal clock signal, whose cycle time is equal to the cycle time of the external clock signal CLK. The comparison circuit 60 also receives (via a control line 62) an enable signal which, for example, is tapped off from the refresh signal control line 34.

The comparison circuit 60 compares the cycle time ($t_{cycle}$) of the high-frequency clock signal (CLK) with a predetermined signal delay time of the data path 38. If the signal delay time of the data path 38 is greater than the cycle time ($t_{cycle}$) of the clock signal (CLK), then the comparison circuit 60 generates an indication signal, which is emitted to the decoder 55 via the indication signal line 59. This indication signal leads to the latency time of the latency time generator 57 being reduced by the cycle time $t_{cycle}$. The read/latency time generator 57 emits an enable signal, which is delayed by the latency time, via a control line 63 to the FIFO register 43 in order to output the data which is applied to the internal data bus 37. The FIFO register 43 is, furthermore, driven via a control line 64 by application of an input pointer from the read/write amplifier 36.

Figure 7:
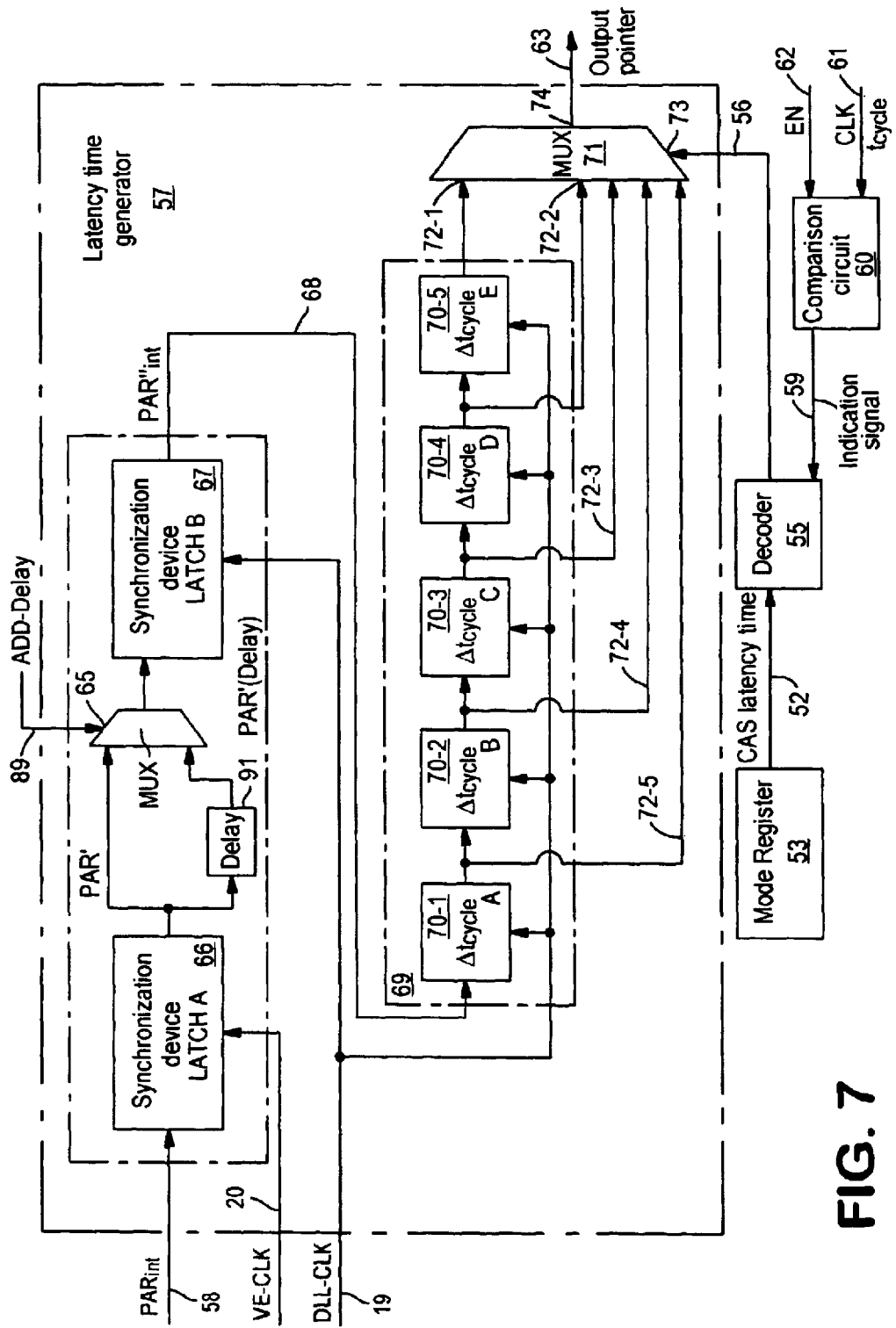
FIG. 7 shows a block diagram of a latency time circuit according to the invention.

FIG. 7 shows a first embodiment of the latency time circuit according to the invention.

The latency time generator 57 receives an internal read command signal PAR-Int from the sequence controller 13 via an internal control line 58. A synchronization circuit 65 synchronizes the received internal control signal to the internal clock signal VE-CLK by means of a latch 66 in a first step and then, in a second step, the received internal control signal is synchronized to the internal clock signal DLL-CLK by means of a latch 67. The synchronized internal read control signal PAR"$_{int}$ is passed via a line 68 to a chain 69 of series-connected time switching elements 70. The time switching elements 70 are each clocked by the internal clock signal DLL-CLK, and each delay an applied signal by the cycle time ($t_{cycle}$) of the clock signal.

The latency time generator 57 contains a multiplexer 71 with a number of signal inputs 72, a control input 73 and a signal output 74. The signal inputs 72 of the multiplexer 71 are each connected via signal lines to one output of a time switching element 70.

If three different possible latency times, namely a latency time of 6, a latency time of 5 and a latency time of 4, can be programmed in the example illustrated in FIG. 7, the multiplexer 71 has a corresponding number of inputs 72. The decoder 55 decodes the programmed latency time and connects the corresponding signal input 72 to the output 74 of the multiplexer as a function of the applied indication signal.

If, in a first operating situation, the comparison circuit 60 identifies that the cycle time of the high-frequency clock signal CLK is greater than the signal delay time of the data path, that is to say in a non-critical situation when the clock signal CLK has not yet reached a critical limit frequency, the associated input 72 of the multiplexer 71 is connected to the signal output 74. In the example illustrated in FIG. 7, the signal input 72-4 is connected to the signal output 74 in order to achieve a stored latency time of 4 clock cycles. The internally synchronized read signal PAR"$_{int}$ is in this case emitted, delayed by two cycle times ($2 \cdot \Delta t_{cycle}$) by the two time switching elements 70-1, 70-2, as an enable signal to the FIFO register 43.

If, conversely, the comparison circuit 60 identifies that the clock frequency of the applied clock signal CLK is sufficiently high that the cycle time ($t_{cycle}$) is shorter than the known signal delay time of the data path 38, it generates an appropriate indication signal for the decoder 55. In this situation, the decoder 55 drives the multiplexer 71 via the control line 56 such that switching takes place from a signal input 72-$n$ to a signal input 72-($n$+1). With a decoded latency time of 4, when the indication signal is received from the comparison circuit 60, switching takes place from the signal input 72-4 to the signal input 72-5, so that the internal synchronized read signal PAR"$_{int}$ is delayed only by one delay element, namely 70-1, that is to say it has a delay time of only $1 \cdot \Delta t_{cycle}$.

Alternatively, on identifying the indication signal, the decoder 55 can reduce the latency time as read from the mode register 53 by the value unity, and can then drive the multiplexer 71 accordingly.

When there is no correction indication signal on the signal line 59, the decoder 55 drives the multiplexer 71 such that the signal delay produced by the time switching elements 70 is equal to the decoded stored latency time.

In the opposite situation, when the comparison circuit 60 is generating an indication signal, the decoder 55 drives the multiplexer 71 such that the signal delay produced by the time switching elements 70 is equal to the stored latency time reduced by one cycle time ($t_{cycle}$).

Figure 8:
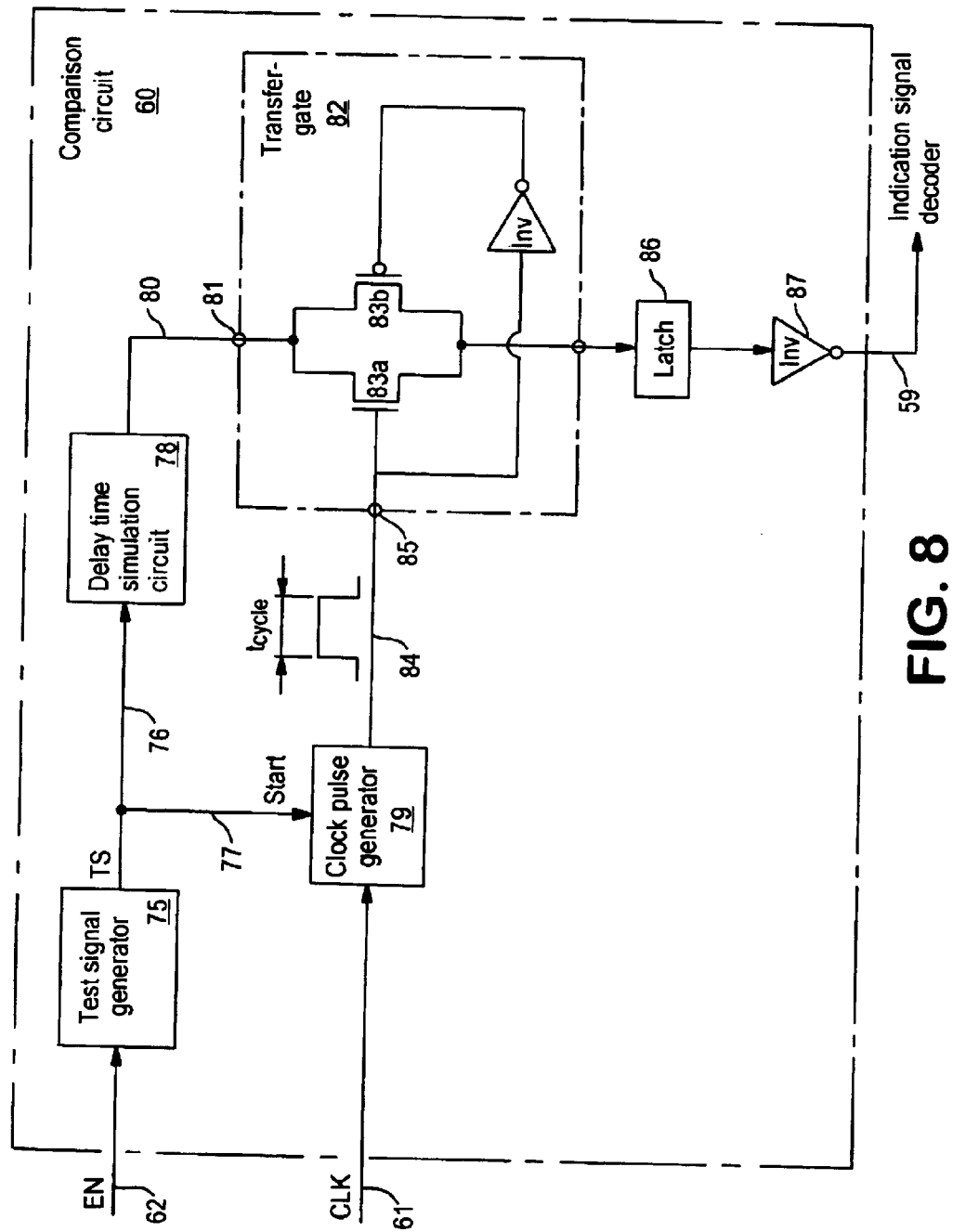
FIG. 8 shows a block diagram of one preferred embodiment of the comparison circuit contained in the latency time circuit according to the invention.

FIG. 8 shows a first embodiment of the comparison circuit 60 of the latency time circuit according to the invention. The comparison circuit 60 is clocked by a clock signal CLK and receives an enable signal EN via a control line 62. The comparison and measurement circuit 60 contains an integrated test signal generator 75. On receiving the enable control signal EN, the test signal generator 75 generates a test signal TS, in the form of a long logic-high pulse, via the control line 62.

Figure 12:
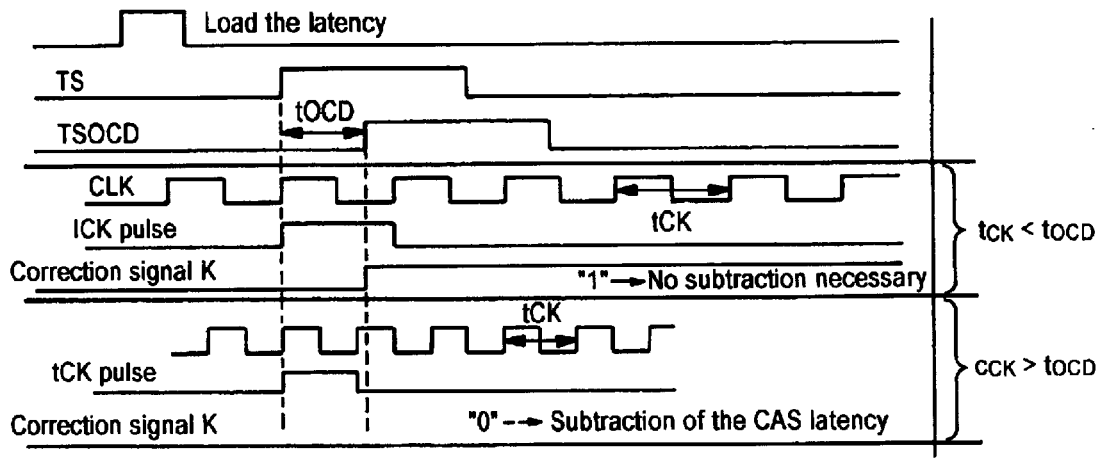
FIG. 12 shows timing diagrams of the signals which are generated in the comparison circuit of the latency time circuit according to the invention.

FIG. 12 shows a timing diagram of the signals which are generated in the comparison circuit 60. The test signal TS is passed via lines 76, 77 to a delay simulation circuit 78 and to a clock pulse generator 79. The test signal TS activates the clock pulse generator 79 such that it generates a signal pulse whose cycle is synchronized to the cycle time $t_{cycle}$ of the external clock signal CLK. The delay simulation circuit 78 has exactly the same signal delay time as the data output path within the data path 38. This means that the signal delay resulting from the delay simulation circuit 78 is equal to the time delay which is caused by the FIFO register 43 and the OCD driver circuit 45. The delay simulation circuit 78 is preferably a circuit whose layout is identical to that of the data output path, that is to say it is an exact layout copy. The delayed signal is passed via a line 80 to an input 81 of a transfer gate circuit 82, which essentially has two transistors 83a, 83b, in a complementary form. The clock pulse which is produced by the clock pulse generator 79 is passed via a line 84 to a control input 85 of the transfer gate circuit 82, and opens the transfer gate 82 exactly for the duration of one clock cycle or for the duration of the cycle time $t_{cycle}$.

If the cycle time $t_{cycle}$ is greater than the signal delay time of the data path, that is to say it is greater than the signal delay of the delay simulation circuit 78, the transfer gate 82 is opened for a sufficiently long time to allow the rising pulse flank of the delayed signal which is applied to the input 81 to be passed to a downstream latch circuit 86. The downstream latch circuit 86 temporarily stores the logic-high signal pulse as a correction bit with a logic-high value. The correction bit is inverted by a downstream inverter circuit 87, and is emitted as an indication signal via the line 59 as a correction indication bit to the decoder 55. The inverted correction indication bit is at a logic-low level and indicates that the clock frequency of an applied clock signal is below the critical limit frequency, so that no correction is required.

If, in the opposite situation, the cycle time $t_{cycle}$ is shorter than the signal delay time of the delay simulation circuit 78, the transfer gate 82 is closed before the rising flank of the delayed signal has passed through the transfer gate 82. In this situation, a logic-low bit is temporarily stored in the latch circuit 86, and is then inverted by the inverter circuit 87. The logic-high indication signal is emitted to the decoder 55, and indicates to the decoder 55 that the external clock signal is at a clock frequency which is above the critical limit frequency. In this situation, a correction must be made, and the latency time of the latency time generator 57 is reduced by one cycle time $t_{cycle}$.

Figure 9:
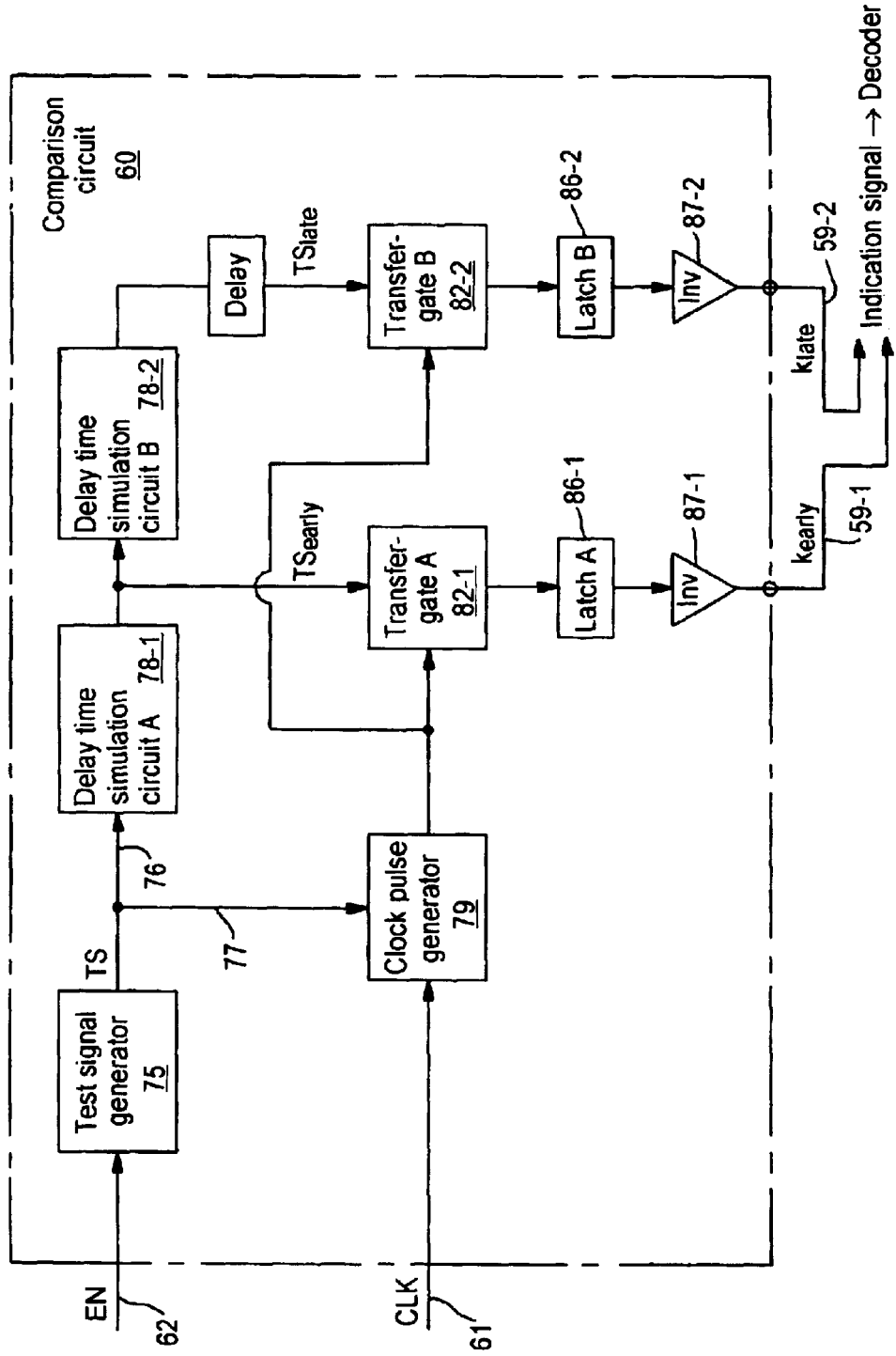
FIG. 9 shows a particularly preferred embodiment of the comparison circuit.

FIG. 9 shows one particularly preferred embodiment of the comparison circuit 60.

The measurement of the cycle time $t_{cycle}$ and/or of the clock frequency of the main clock cycle CLK is essential for the method of operation of the S-DRAM chip 1. The measurement phase must in this case be carried out as exactly as possible, for the result to be correct for every change in the operating frequency. The clock frequency of the clock signal is generally not stable, owing to fluctuations of a statistical nature, such as noise and phase jitter. This means that there is a lower limit and an upper limit for the cycle time $t_{cycle}$, between which the cycle time of the clock signal varies during operation.

Figure 13:
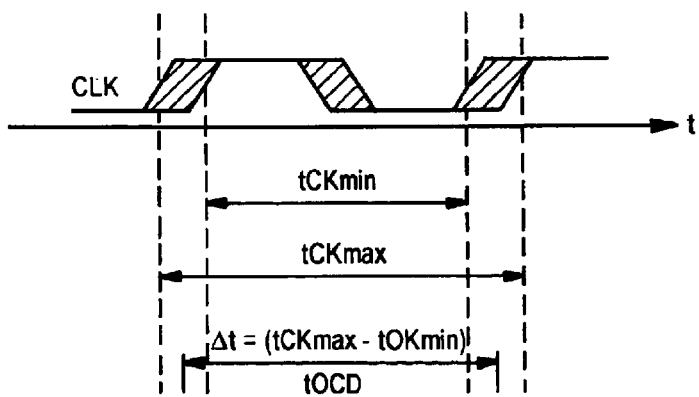
FIG. 13 shows possible fluctuations of the cycle time.

FIG. 13 shows the fluctuations of the cycle time during practical operation of an S-DRAM memory 1. The generation of the clock pulse by the clock pulse generator 79 generates a clock pulse whose duration corresponds to the cycle time $t_{cycle}$ within this value range. If the signal delay time caused by the delay simulation circuit 78 is close to the cycle time $t_{cycle}$, this can lead to incorrect decisions. If the cycle time $t_{cycle}$ fluctuates between $t_{cycle-min}$ and $t_{cycle-max}$ during operation, the S-DRAM memory 1 will output the data at the correct or incorrect time on a statistically distributed basis, rendering defined operation of the entire system impossible.

The comparison circuit 60 which is illustrated in FIG. 9 overcomes this problem by connecting a number of delay simulation circuits 78-1, 78-2 in series, and by tapping off a delayed signal in each case ($TS_{early}$, $TS_{late}$).

There are three operating situations for the decoder 55.

If the correction bit $K_{early}=0$ and, at the same time, the other correction bit $K_{Late}=0$, then the signal delay time is shorter than the minimum clock cycle time and is thus in a time range in which the latency time need not be corrected.

If the first correction bit $K_{early}=1$ and the other correction bit $K_{late}=1$, the signal delay time is longer than the maximum clock cycle time, and is thus in a time range in which the latency time must be reduced by one cycle time.

If the first correction bit $K_{early}=0$ and, at the same time, the second correction bit $K_{late}=1$, the signal delay time is in a critical range, that is to say it is between a minimum cycle time $t_{cycle-min}$ and a maximum cycle time $t_{cycle-max}$.

Figure 10:
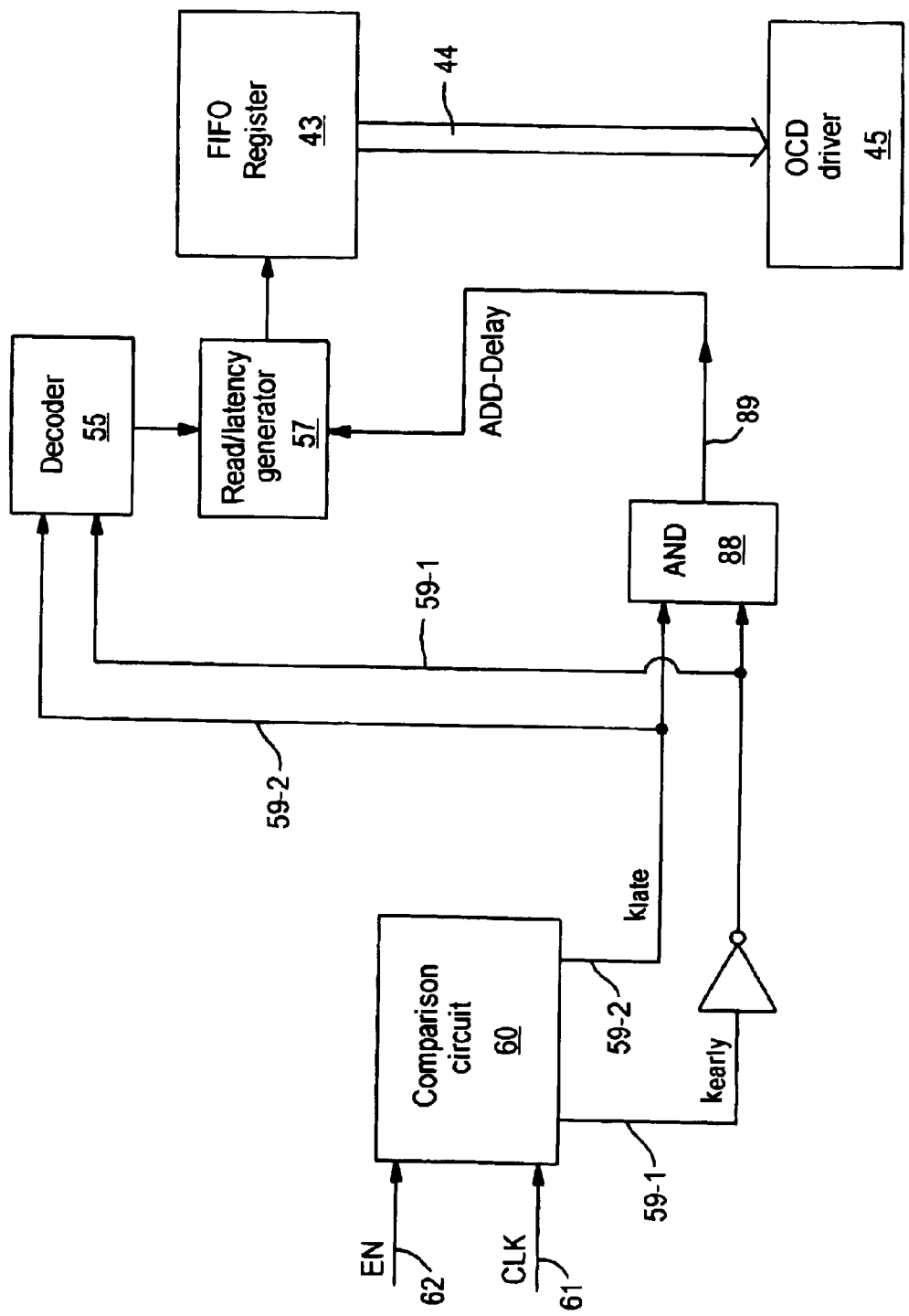
FIG. 10 shows a preferred embodiment of the latency time circuit according to the invention.

In this situation, at least one delay time Δt is added, or an appropriate signal delay is introduced. In the third operating situation, when the signal delay time is in the critical range, the logic gate 88 (as is illustrated in FIG. 10) generates a control signal which is emitted via a control line 89 to a multiplexer 90, which is provided in the latency time generator 57. This control signal results in switching from a first signal line to a signal line which is delayed by a delay circuit 91.

If the signal delay time of the data path ($t_{OCD}+t_{FIFO}$) is equal to the minimum cycle time $t_{cycle-min}$, or $t_{cycle-min}<(t_{OCD}+t_{FIFO})<t_{cycle-max}$, a delay is introduced which results in the synchronization of PAR' to PAR" being carried out reliably on the second DLL flank, and this deliberate error being corrected again by subtracting one latency time.

If the signal delay time $t_{OCD}$ is equal to the maximum cycle time $t_{cycle-max}$, then the DELAY is not switched on.

In both situations, the signal delay time is reliably in the range in which the latency time must be subtracted by one cycle time [sic]. This results in an operational state which is protected against all fluctuations in the operating frequency.

The delay simulation circuit 78 which is contained in the comparison circuit 60 and as illustrated in FIGS. 8, 9 simulates the signal delay times of the data path 38. For process stability reasons, the delay simulation circuit 78 is formed by a 1:1 copy of the existing implemented data output circuit, which comprises the FIFO register 42 and the OCD driver 45. Since the data output path has a relatively complex construction, a corresponding delay simulation circuit 78 likewise has very complex circuitry and requires a relatively large amount of space on the integrated chip.

In one preferred embodiment, the comparison circuit 60 is thus integrated in the DLL circuit 18 of the S-DRAM 1. The delay locked loop DLL circuit 18 already contains a delay simulation circuit, which can likewise be used for the same purpose as comparison circuit 60. One preferred embodiment of such an integrated comparison and DLL circuit 18 is illustrated in FIG. 11.

Figure 11:
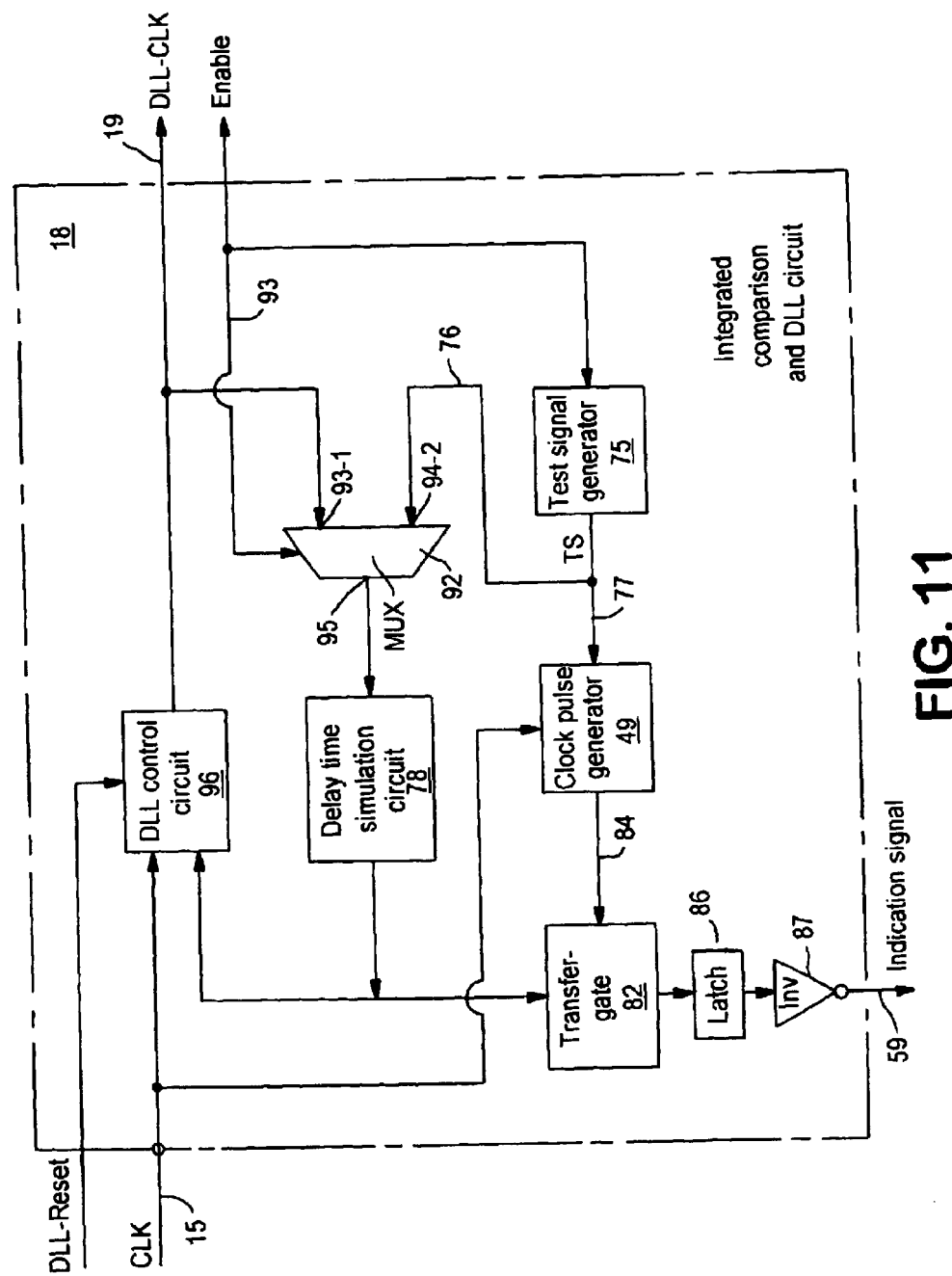
FIG. 11 shows a particularly preferred embodiment of the latency time circuit according to the invention, in which the comparison circuit is integrated in a DLL circuit.

The integrated comparison/DLL circuit 18 in FIG. 11 contains an additional multiplexer 92, which receives (via a control line 93) the enable signal which is intended for the test signal generator 75. The multiplexer 92 has a first signal input 94-1 and a second signal input 94-2. On the output side, the multiplexer 92 is connected via an output 95 to the delay simulation circuit 78. On receiving the enable signal EN for the test signal generator 75, the multiplexer 92 connects the second input 94-2 to the delay simulation circuit 78 in order to measure the cycle time $t_{cycle}$ of the clock signal CLK.

If no enable signal EN is received via the control line 93, the signal input 94-1 is connected to the delay simulation circuit 78. The first input 94-1 of the multiplexer 92 is connected to a DLL control circuit 96. If the multiplexer 92 does not receive an enable signal, the integrated comparison and DLL circuit 18 operates in the same way as a conventional DLL circuit. The major advantage of the integrated comparison and DLL circuit, as it is illustrated in FIG. 11, is that the delay simulation circuit 78 carries out two functions, namely on the one hand for the DLL circuit and on the other hand for the comparison circuit 60.

This leads to a saving in chip area and thus to lower costs for production of the S-DRAM chip 1.

List of Reference Symbols
1 S-DRAM
2 Command PADS
3 External control bus
4 Address PADS
5 External address bus
6 Data PADS
7 External data bus
8 Lines
9 Command receiver
10 Lines
11 Command decoder
12 Control lines
13 Sequence controller
14 Clock line
15 Clock signal line tree
16 Clock signal reciever
17 Clock generator circuit
18 Delay locked loop
19 Clock line
20 Delay element
17a Line
18a Clock signal PAD 19a External clock line
20a Clock line
21 Control line
22 Row address latch
23 Control line
24 Column address latch
25 Internal address bus
26 Address signal receiver
27 Lines
28 Address lines
29 Row address decoder
30 Address lines
31 Column address decoder
32 Address decoder
33 Memory cell array
34 Refresh control line
35 Lines
36 Read/write amplifier
38 Data path
39 Data receiver
40 Lines
41 Lines
42 Driver circuit
43 FIFO register
44 Lines
45 Data output driver
46 Lines
47 Write/latency time generator
48 Control line
49 Control line
50 Control line
51 Decoder
52 Internal control bus
53 Operating mode register
54 Control line
55 Decoder
56 Control line
57 Read/latency time generator
58 Control line
59 Indication signal line
60 Comparison circuit
61 Clock signal line
62 Enable control line
63 Control line
64 Control line
65 Synchronization circuit
66 Synchronization latch
67 Synchronization latch
68 Line
69 Delay chin
70 Time switching elements
72 Triplex inputs
73 Triplex control inputs
74 Multiplexer output
75 Test signal generator
76 Line
77 Line
78 Delay time simulation circuit
79 Clock pulse generator
80 Line
81 Input
82 Transfer switching gate
83 Transistors
84 Line
85 Clock input
86 Latch circuit
87 Inverter
88 Logic gate
89 Control line
90 Multiplexer
91 Delay circuit
92 Multiplexer
93 Multiplexer control line
94 Multiplexer input
95 Multiplexer output
96 DLL control circuit

What is claimed is:

1. Latency time circuit for an S-DRAM, which is clocked by a high-frequency clock signal, for producing a delayed data enable signal for synchronous data transfer through a data path of the S-DRAM, having:
   (a) a controllable latency time generator for delaying a decoded external data enable signal with an adjustable latency time, wherein
   (b) a comparison circuit which compares a cycle time of the high-frequency clock signal with a predetermined signal delay time of the data path, and reduces the latency time of the latency time generator by the cycle time if the signal delay time of the data path is greater than the cycle time of the clock signal.

2. Latency time circuit according to claim 1, wherein a register is provided for storing a predetermined latency time.

3. Latency time circuit according to claim 1, wherein a decoder is provided, which decodes the stored latency time in order to produce an internal control signal for the latency time generator.

4. Latency time circuit according to claim 1, wherein the comparison circuit emits a correction indication signal to the decoder if the signal delay time of the data path is greater than the cycle time of the clock signal.

5. Latency time circuit according to claim 1, wherein the controllable latency time generator has a number of series-connected time switching elements, each of which passes on a signal which is applied to a signal input, in each case delayed by the cycle time, at its signal output.

6. Latency time circuit according to claim 1, wherein the signal outputs of the time switching elements are each connected to one signal input of a controllable multiplexer within the latency time generator.

7. Latency time circuit according to claim 6, wherein the multiplexer has a control input for the internal control signal which is emitted by the decoder.

8. Latency time circuit according to claim 1, wherein the signal delay of all the series-connected time switching elements is equal to a maximum latency time minus two.

9. Latency time circuit according to claim 1, wherein the decoder drives the multiplexer in the absence of the correction indication signal such that the signal delay which is produced by the time switching elements is equal to the stored latency time reduced by two cycle times, and wherein the decoder drives the multiplexer on receiving the correction indication signal such that the signal delay which is produced by the time switching elements is equal to the stored latency time reduced by a further cycle time.

10. Latency time circuit according to claim 1, wherein the latency time generator has a synchronization circuit for synchronization of the decoded data enable signal to an internal clock signal.

11. Latency time circuit according to claim 1, wherein the comparison circuit has:
    (a) a test signal generator for producing a test signal;
    (b) a data path delay time circuit, which delays the test signal that is produced by the signal delay time of the data path, (c) a clocked clock pulse generator for producing a clock pulse whose pulse duration is equal to the cycle time of the clock signal;

(d) a transfer gate circuit with an input for application of the delayed test signal, (e) a clock input for application of the clock signal pulse that is produced and having an output to which the test signal which is produced is passed on when the delay time of the data path delay time circuit is longer than the pulse duration of the clock pulse which is produced by the clock pulse generator; and (f) a latch circuit for temporary storage of the passed-on test signal.

12. Latency time circuit according to claim 1, wherein the test signal is a logic-high signal pulse with a long pulse duration.

13. Latency time circuit according to claim 1, wherein the test signal which is passed on is temporarily stored as a correction indication bit in the latch circuit.

14. Latency time circuit according to claim 1, wherein the data path delay time circuit is a circuit whose layout is identical to the data path.

15. Latency time circuit according to claim 1, wherein the test signal generator produces the test signal after receiving an enable signal from an internal sequence controller of the S-DRAM.

16. Latency time circuit according to claim 1, wherein the data path has a data FIFO register and a data output driver circuit.

17. Latency time circuit according to claim 1, wherein the data path delay time circuit has a number of series-connected delay elements, each of whose signal outputs can be passed on to a latch circuit through an associated transfer switching gate.

18. Latency time circuit according to claim 1, wherein the comparison circuit is integrated in a DLL circuit of the S-DRAM.

19. Latency time circuit according to claim 1, wherein, if the signal delay of the data path is equal to a minimum cycle time, a delay circuit is connected in between.

\* \* \* \* \*